(12) United States Patent
Liu

(10) Patent No.: US 8,314,499 B2
(45) Date of Patent: Nov. 20, 2012

(54) FLEXIBLE AND STACKABLE SEMICONDUCTOR DIE PACKAGES HAVING THIN PATTERNED CONDUCTIVE LAYERS

(75) Inventor: Yong Liu, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 79 days.

(21) Appl. No.: 12/271,369

(22) Filed: Nov. 14, 2008

(65) Prior Publication Data

US 2010/0123257 A1  May 20, 2010

(51) Int. Cl.
    *H01L 23/48* (2006.01)
(52) U.S. Cl. .......... 257/777; 257/237; 257/775
(58) Field of Classification Search .......... 257/777
    See application file for complete search history.

(56) References Cited

U.S. PATENT DOCUMENTS

| | | | |
|---|---|---|---|
| 5,198,888 A | 3/1993 | Sugano et al. | |
| 5,757,080 A * | 5/1998 | Sota | 257/777 |
| 5,892,271 A | 4/1999 | Takeda et al. | |
| 6,133,634 A | 10/2000 | Joshi | |
| 6,316,838 B1 * | 11/2001 | Ozawa et al. | 257/778 |
| 6,423,623 B1 | 7/2002 | Bencuya et al. | |
| 6,459,148 B1 | 10/2002 | Chun-Jen et al. | |
| 6,489,678 B1 | 12/2002 | Joshi | |
| 6,545,367 B2 | 4/2003 | Sota | |
| 6,611,055 B1 * | 8/2003 | Hashemi | 257/706 |
| 6,627,991 B1 | 9/2003 | Joshi | |
| 6,645,791 B2 | 11/2003 | Noquil et al. | |
| 6,661,082 B1 | 12/2003 | Granada et al. | |
| 6,696,321 B2 | 2/2004 | Joshi | |
| 6,731,013 B2 | 5/2004 | Juso et al. | |
| 6,777,800 B2 | 8/2004 | Madrid et al. | |
| 6,876,066 B2 | 4/2005 | Fee et al. | |
| 6,893,901 B2 | 5/2005 | Madrid | |
| 6,953,988 B2 | 10/2005 | Seo et al. | |
| 6,977,431 B1 | 12/2005 | Oh et al. | |
| 6,992,384 B2 | 1/2006 | Joshi | |
| 7,023,077 B2 | 4/2006 | Madrid | |
| 7,061,077 B2 | 6/2006 | Joshi | |
| 7,101,734 B2 | 9/2006 | Granada et al. | |
| 7,122,884 B2 | 10/2006 | Cabahug et al. | |
| 7,157,799 B2 | 1/2007 | Noquil et al. | |

(Continued)

OTHER PUBLICATIONS

U.S. Appl. No. 12/200,819, filed Aug. 28, 2008, entitled, "Molded Ultra Thin Semiconductor Die Packages, Systems Using the Same, and Methods of Making the Same".

(Continued)

*Primary Examiner* — David Vu
*Assistant Examiner* — Caleb Henry
(74) *Attorney, Agent, or Firm* — Hiscock & Barclay, LLP

(57) ABSTRACT

Disclosed are semiconductor die packages, systems, and methods therefor. An exemplary package comprises a patterned conductive layer having a first surface, a second surface, and a first thickness between its first and second surfaces; a semiconductor die disposed over the first surface of the patterned conductive layer and electrically coupled thereto; a plurality of conductive bodies disposed at the second surface of the patterned conductive layer and electrically coupled thereto, each conductive body having a thickness that is greater than the first thickness; and a body of electrically insulating material disposed on the semiconductor die and a portion of the first surface of the patterned conductive layer. A further embodiment farther comprises a second semiconductor die disposed over the second surface of the patterned conductive layer and electrically coupled thereto.

24 Claims, 6 Drawing Sheets

U.S. PATENT DOCUMENTS

| | | | |
|---|---|---|---|
| 7,217,594 | B2 | 5/2007 | Manatad |
| 7,315,077 | B2 | 1/2008 | Choi et al. |
| 7,364,784 | B2 | 4/2008 | Kim et al. |
| 7,402,462 | B2 | 7/2008 | Madrid et al. |
| 7,439,613 | B2 | 10/2008 | Joshi et al. |
| 7,638,861 | B2 * | 12/2009 | Choi et al. .................... 257/676 |
| 2003/0107126 | A1 | 6/2003 | Joshi |
| 2004/0108586 | A1 | 6/2004 | Lamson et al. |
| 2008/0265434 | A1 * | 10/2008 | Kurita ........................... 257/777 |
| 2009/0146284 | A1 | 6/2009 | Kim et al. |

OTHER PUBLICATIONS

U.S. Appl. No. 12/235,227, filed Sep. 22, 2008, entitled "Stacking Quad Pre-Molded Component Packages, Systems Using the Same, and Methods of Making the Same".

U.S. Appl. No. 12/328,541, filed Dec. 4, 2008, entitled "Molded Leadless Package and Assemblies Having Stacked Molded Leadless Packages".

Rao Tummala, "*The SOP Technology for Convergent Electronic & Bio-electronic Systems*", 1$^{st}$ International Workshop on SOP, SIP, SOP Electronics Technologies, Sep. 22-23, 2005, Atlanta, Georgia, 31 pages.

"FSA2464 0.4 ΩLow-Voltage Dual DPDT Analog Switch", Apr. 2008, Fairchild Semiconductor, 12 pages.

International Search Report and Written Opinion of the International Searching Authority for PCT Application No. PCT/US2009/061689, mailed May 31, 2010, 11 pages.

* cited by examiner

FLEXIBLE AND STACKABLE SEMICONDUCTOR DIE PACKAGES HAVING THIN PATTERNED CONDUCTIVE LAYERS

CROSS-REFERENCES TO RELATED APPLICATIONS

NOT APPLICABLE

BACKGROUND OF THE INVENTION

Personal portable electronic products, such as cell phones, personal data assistants, digital cameras, laptops, etc., are generally comprised of several packaged semiconductor IC chips and surface mount components assembled onto interconnect substrates, such as printed circuit boards and flex substrates. There is an ever increasing demand to incorporate more functionality and features into personal portable electronic products, while at the same time shrink the sizes of such devices. This, in turn, has placed ever increasing demands on the design, size, and assembly of the interconnect substrates. As the number of assembled components increases, substrate areas and costs increase, while demand for a smaller form factor increases.

BRIEF SUMMARY OF THE INVENTION

As part of making his invention, the inventor has recognized that there is a need to address the above issues and that it would be advantageous to find ways to enable increases in functionality and performance of electronic products without causing increases in substrate areas and costs, and decreases in product yields. As also part of making the invention, the inventor has recognized that many electronic products have several electrical components, particularly semiconductor dice, that can be grouped together in several small groups that provide specific functions. The inventor has further discovered that the substrate area required for a circuit group can be significantly decreased by packaging semiconductor dice and other components in molded packages that can be stacked on top of one another to reduce board space and increase functionality, where each such package may have the thickness of less than one millimeter.

Accordingly, a first general exemplary embodiment according to the invention is directed to a semiconductor die package comprising a patterned conductive layer having a first surface, a second surface, and a first thickness between its first and second surfaces; a semiconductor die disposed over the first surface of the patterned conductive layer and electrically coupled thereto; a plurality of conductive bodies disposed at the second surface of the patterned conductive layer and electrically coupled thereto, each conductive body having a thickness that is greater than the first thickness; and a body of electrically insulating material disposed on the semiconductor die and a portion of the first surface of the patterned conductive layer. A further embodiment further comprises a second semiconductor die disposed over the second surface of the patterned conductive layer and electrically coupled thereto.

With this exemplary construction, the semiconductor die package may be as thin as the thicknesses of the semiconductor dice it houses plus the thickness of the patterned conductive layer, with signals to and from the dice being conveyed by the conductive bodies. Various surface mount components may be added to this and other embodiments disclosed herein. In a further embodiment, a second instance of the package, without a body of electrically insulating material, may be stacked below the package, with respective conductive bodies being aligned and electrically coupled together. With this exemplary construction, packages may be stacked upon one another to electrically interconnect several electrical components to provide increased functionality within the area footprint of a single component package. The layout of the patterned conductive layers among the packages may be varied to provide a desired interconnect among the stacked components. As another benefit of this exemplary embodiment, electrical components, such as semiconductor dice, having the same circuitry may be stacked and electrically coupled in parallel to provide additional performance within the footprint of a single package, as opposed to using a large device packaged in a larger footprint package. For example, small-scale power-switching MOSFET transistors on individual die may be housed in similar packages with a power IC controller having the same small footprint, and may be stacked and electrically coupled in parallel to provide the power-handling performance of a much larger MOSFET device housed in a larger footprint package.

Another general embodiment according to the invention is directed to a method of manufacturing a semiconductor die package, comprising: forming a patterned conductive layer over a metallic substrate, the patterned conductive layer having a first surface, a second surface, a first thickness between its first and second surfaces, and a plurality of traces, the metallic substrate having a first surface disposed on the second surface of the conductive layer, a second surface, and a second thickness between its first and second surfaces, the first thickness being less than the second thickness; assembling a semiconductor die and the first surface of the patterned conductive layer together such that a plurality of conductive regions on a surface of the semiconductor die are electrically coupled to a plurality of the traces of the patterned conductive layer; disposing a body of an electrically insulating material over the semiconductor die and a portion of the first surface of the patterned conductive layer; and pattern etching the metallic substrate at its second surface to define conductive regions and exposing a portion of the second surface of the patterned conductive layer.

A further embodiment further comprises assembling a second semiconductor die and the exposed second surface of the patterned conductive layer together such that a plurality of conductive regions on a surface of the second semiconductor die are electrically coupled to a plurality of the traces of the patterned conductive layer; and disposing a body of an electrically insulating material along at least the sides of the second semiconductor die.

The present invention also encompasses systems that include packages and package assemblies according to the present invention, each such system having an interconnect substrate and a package or package assembly according to the present invention attached to the interconnect substrate, with electrical connections made therewith.

The above exemplary embodiments and other embodiments of the invention are described in the Detailed Description with reference to the Figures. In the Figures, like numerals may reference like elements and descriptions of some elements may not be repeated.

DETAILED DESCRIPTION OF THE INVENTION

Figure 1:
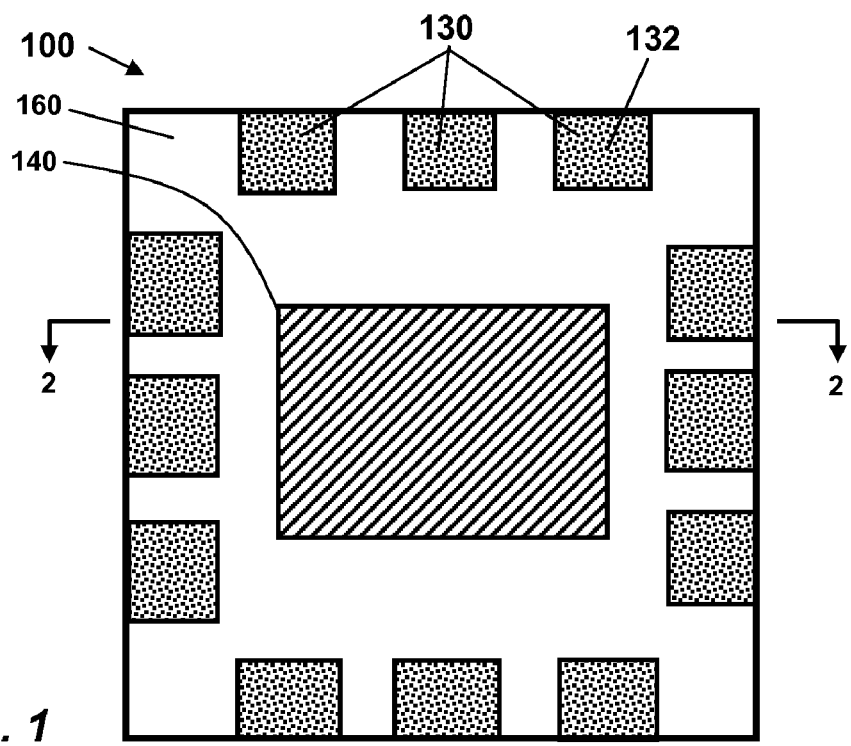
FIG. 1 shows a bottom plan view of an exemplary semiconductor die package according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

Figure 2:
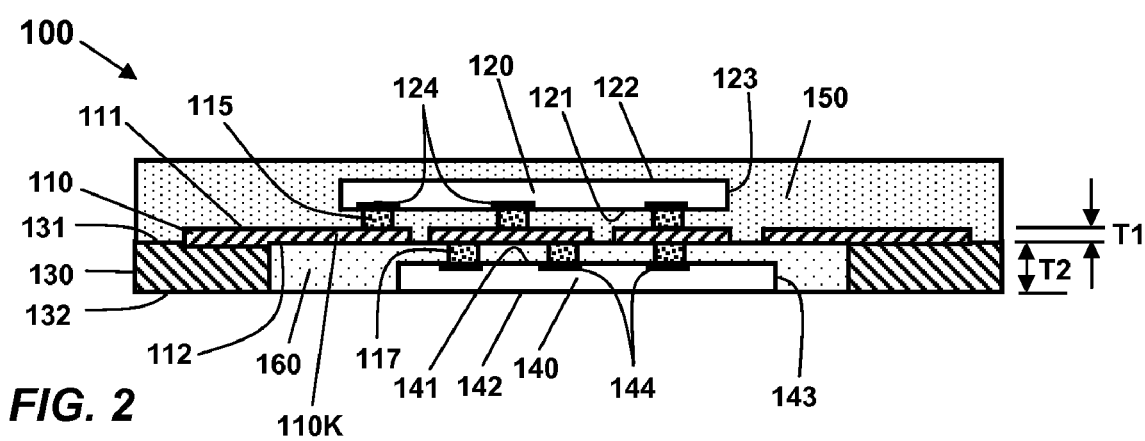
FIG. 2 shows a cross section view of the exemplary semiconductor die package shown in FIG. 1 according to the present invention.

FIG. 1 is a bottom plan view of an exemplary embodiment 100 of a semiconductor die package according to the present invention, and FIG. 2 is a cross-sectional view thereof taken along the line 2-2 shown in FIG. 1. Referring to both FIGS. 1 and 2, semiconductor die package 100 comprises a patterned conductive layer 110 having a first surface 111, a second surface 112, and a thickness T1 between surfaces 111 and 112, and a first semiconductor die 120 disposed above the first surface 111 of the patterned conductive layer 110 and electrically coupled thereto. Semiconductor die 120 has a top surface 121, a bottom surface 122, side surfaces 123 between the top and bottom surfaces, and a plurality of conductive regions 124 disposed on the die's top surface 121. Semiconductor die package 100 further comprises a plurality of conductive bodies 130 disposed at the second surface 112 of the patterned conductive layer 110 and electrically coupled thereto. Each conductive body 130 has a first surface 131 facing the second surface 112 of conductive layer 110, a second surface 132, and a thickness T2 between its surfaces 131 and 132. Thickness T2 is greater than thickness T1. Thickness T1 may range between 2 microns to 20 microns, with a value of 10 microns being typical; and thickness T2 may range between 50 microns to 500 microns, with a value of 100 microns to 200 microns being typical.

Patterned conductive layer 110 is patterned to define a plurality of traces 110A-110L that interconnect the conductive regions of die 120 with corresponding ones of bodies 130. For visual clarity, only one of these traces, trace 110K is identified in FIG. 2; all of the traces 110A-110L are shown and identified in FIG. 3. Referring to FIG. 2, conductive regions 124 of semiconductor die 120 are electrically coupled to corresponding portions of the traces 110A-110L; they may be electrically coupled by electrically conductive adhesive members 115, which may comprise stud bumps, solder bumps, and the like. Conductive adhesive members 115 may be initially disposed on semiconductor die 120, and the die and adhesive members 115 may be flip-chip bonded to traces 110A-110L at the first surface 111 of layer 110. Other portions of the traces 110A-110L are electrically coupled to corresponding ones of conductive bodies 130. The trace portions may be direct metal bonded to the conductive bodies 130. As described below in greater detail with respect to an exemplary method according to the present invention, layer 110 is deposited and/or plated over a thick metal substrate and metallurgically bonded thereto, and thereafter patterned to form traces 110A-110L. The thick metal substrate preferably comprises a metal different from that of layer 110 to facilitate the patterning. The thick metal substrate is thereafter etched to define conductive bodies 130.

Semiconductor die package 100 further comprises a second semiconductor die 140 disposed over second surface 112 of the patterned conductive layer 110 and electrically coupled thereto. Semiconductor die 140 has a top surface 141, a bottom surface 142, side surfaces 143 between the top and bottom surfaces, and a plurality of conductive regions 144 disposed on the die's top surface 141. Conductive regions 144 of semiconductor die 140 are electrically coupled to corresponding portions of the traces 110A-110L; they may be electrically coupled by conductive adhesive members 117, which may comprise stud bumps, solder bumps, and the like. Conductive adhesive members 117 may be initially disposed on semiconductor die 140, and the die and adhesive members 117 may be flip-chip bonded to traces 110A-110L at the second surface 112 of layer 110.

Semiconductor die package 100 further comprises a first body 150 of electrically insulating material disposed over semiconductor die 120 and first surface 111 of the patterned conductive layer 110. Body 150 may comprise an epoxy (such as an epoxy molding compound), a silicone, and/or a polyimide (i.e., it may comprise one or more of these materials). Semiconductor die package 100 further comprises a second body 160 of electrically insulating material disposed over second surface 112 of the patterned conductive layer 110, and adjacent to the side surfaces 143 of second semiconductor die 140. Body 160 may be disposed to cover second surface 142 of die 140, or may be disposed so as to leave second surface 142 exposed. The latter configuration allows the second surface 142 to be electrically coupled to an interconnect substrate when die 140 has one or more electrical terminals on its second surface 142, and/or terminally coupled to an interconnect substrate for dissipation of heat. Body 160 is also preferably disposed so as to leave the second surfaces 132 of conductive bodies 130 exposed. This enables package 100 to be mounted to an interconnect substrate with the second surfaces 132 electrically coupled to conductive regions of the interconnect substrate with solder bonds, and the like. Body 160 may comprise an epoxy (such as an epoxy molding compound), a silicone, and/or a polyimide (i.e., it may comprise one or more of these materials). Body 160 may also comprise an underfill material that is disposed around the sides 143 of semiconductor die 140, and which may be sucked in to cover the die's first surface 141 by capillary action.

Figure 3:
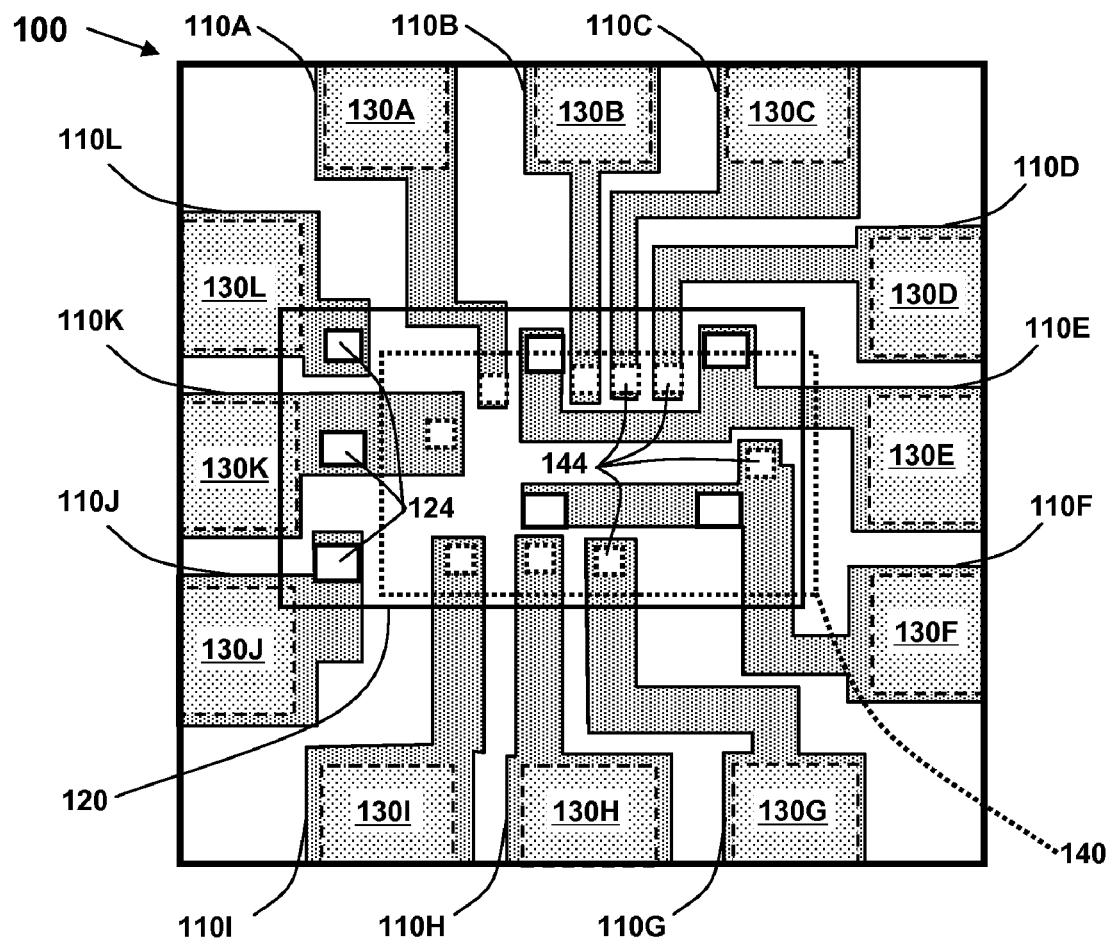
FIG. 3 shows a top plan view of selected elements of the exemplary semiconductor die package shown in FIG. 1 according to the present invention.

FIG. 3 shows a top plan view of package 100 with insulating body 150 removed. Conductive layer 110 comprises traces 110A-110L, and conductive bodies 130 are individually designated by reference numbers 130A-130L, which are electrically coupled to conductive traces 110A-110L, respectively. The outlines of first semiconductor die 120 and its conductive regions 124 are shown with solid lines, and outlines of second semiconductor die 140 and its conductive regions 144 are shown with dotted lines. While many of the conductive traces electrically couple individual conductive regions 124/144 to corresponding conductive bodies 130, each of conductive traces 110F and 110K electrically couple conductive regions 124 of first die 120 to conductive regions 144 of second die 140, as well as to conductive regions 130F and 130K. Accordingly, an advantage of the present invention is to provide multiple dice in an ultra-thin package with electrical interconnection among the dice and conductive bodies 130, which provide connection terminals for the package. This provides packages with greater circuit functionality within the footprint and volume of a small and ultra thin package.

While semiconductor die package 100 has been illustrated as having two semiconductor die, it may be appreciated that a package according to the present invention may be constructed with one or more additional semiconductor dice, which may be added to either or both surfaces 111 and 112 of patterned conductive layer 110. It may also be appreciated that a package according to the present invention may omit second semiconductor die 140, and may further omit body 160.

Figure 4:
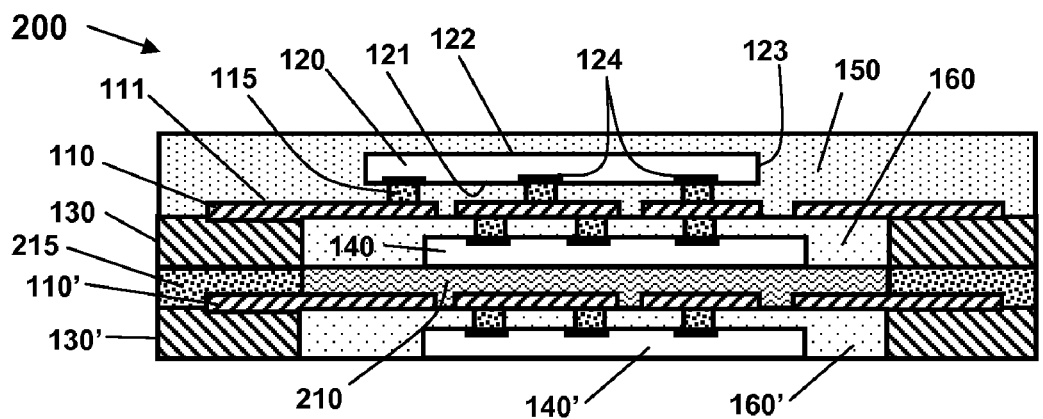
FIG. 4 shows a cross section view of another exemplary semiconductor die package according to the present invention.

FIG. 4 is a cross-sectional view of another exemplary embodiment 200 of a semiconductor die package according to the present invention. Package 200 comprises the same elements of package 100 arranged in the same way. Package 200 further comprises a second patterned conductive layer 110', a second set of conductive bodies 130', a third semiconductor die 140', an electrically insulating layer 210, and a plurality of electrically conductive adhesive members 215. Elements 110', 130', and 140' are disposed and coupled together in a manner similar to elements 110, 130, and 140 of package 100. Semiconductor die 140' may be the same as die 140 or may be different. Patterned conductive layer 110' may comprise the same conductive traces as patterned conductive layer 110, or may comprise a different number of traces, with some or all of the traces having different shapes, configurations, and interconnections. Conductive bodies 130' typically have the same number and configuration as conductive bodies 130; however, their number and configuration may be different from those of bodies 130. The assembly of elements 110', 130', and 140' is disposed such that second patterned conductive layer 110' faces conductive bodies 130 and second semiconductor die 140, with electrically conductive adhesive members 215 being disposed between facing bodies 130 and 130' and electrically coupling respective pairs of conductive bodies 130 and 130', as illustrated in the figure. Electrically insulating layer 210 may be disposed between second semiconductor die 140 and second patterned conductive layer 110' to prevent electrical coupling between them.

Semiconductor die package 200 further comprises a third body 160' of electrically insulating material disposed over the under surface of second patterned conductive layer 110', and adjacent to the side surfaces of third semiconductor die 140'. Body 160' may be disposed to cover the bottom surface of die 140', or may be disposed so as to leave the bottom surface exposed. The latter configuration allows the bottom surface to be electrically coupled to an interconnect substrate when third die 140' has one or more electrical terminals on its bottom surface, and/or thermally coupled to an interconnect substrate for dissipation of heat, or to enable another set of elements 110-140 to be stacked below with a minimum spacing distance. Body 160' is also preferably disposed so as to leave the bottom surfaces of conductive bodies 130' exposed. This enables package 200 to be mounted to an interconnect substrate with the bottom surfaces electrically coupled to conductive regions of the interconnect substrate with solder bonds, and the like. Body 160' may comprise an epoxy (such as an epoxy molding compound), a silicone, and/or a polyimide (i.e., it may comprise one or more of these materials). Body 160' may also comprise an underfill material that is disposed around the sides of semiconductor die 140', and which may be sucked in to cover the die's top surface by capillary action.

Figure 5:
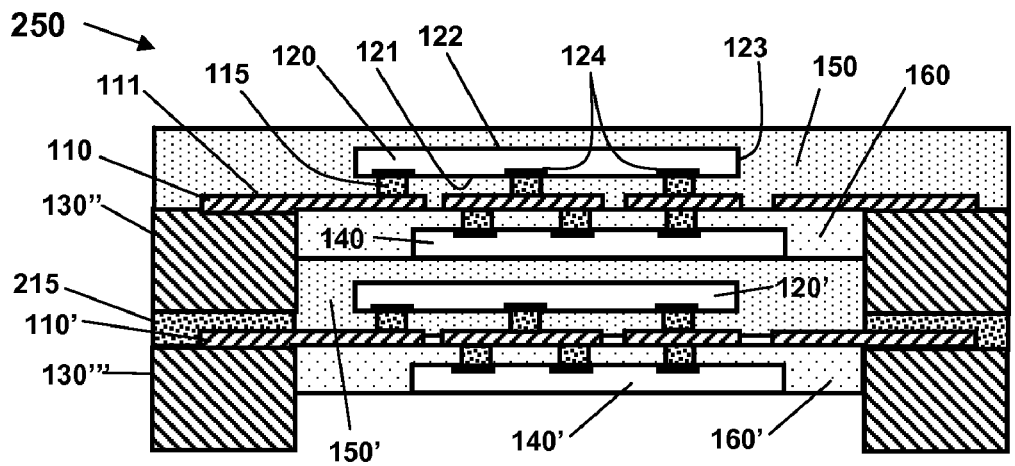
FIG. 5 shows a cross section view of another exemplary semiconductor die package according to the present invention.

FIG. 5 is a cross-sectional view of another exemplary embodiment 250 of a semiconductor die package according to the present invention. Package 250 comprises the same elements of package 100 arranged in the same way, except that conductive bodies 130 are replaced with conducive bodies 130" that have greater thickness. The greater thickness will enable an instance of a package to be stacked below another instance of the package. Package 250 further comprises a second patterned conductive layer 110', a second set of conductive bodies 130'", a third semiconductor die 120', a fourth semiconductor die 140', a body 150' of electrically insulating material, and a plurality of electrically conductive adhesive members 215. Elements 110', 130''', 120', 140', and 150' are disposed and coupled together in a manner similar to elements 110, 130, 120, 140, and 150 of package 100, with the exception that body 150' does not cover the top surfaces of conductive bodies 130'''. Semiconductor die 120' may be the same as die 120 or may be different; semiconductor die 140' may be the same as die 140 or may be different. Patterned conductive layer 110' may comprise the same conductive traces as patterned conductive layer 110, or may comprise a different number of traces, with some or all of the traces having different shapes, configurations, and interconnections. Conductive bodies 130''' typically have the same number and configuration as conductive bodies 130''; however, their number and configuration may be different from those of bodies 130''. The assembly of elements 110', 130''', 120, 140', and 150' is disposed such that second patterned conductive layer 110' faces conductive bodies 130'' and second semiconductor die 140, with electrically conductive adhesive members 215 being disposed between facing bodies 130'' and 130''' and electrically coupling respective pairs of conductive bodies 130'' and 130''', as illustrated in the figure.

Semiconductor die package 250 further comprises a third body 160' of electrically insulating material disposed over the under surface of second patterned conductive layer 110', and adjacent to the side surfaces of third semiconductor die 140'. Body 160' may be disposed to cover the bottom surface of die 140', or may be disposed so as to leave the bottom surface exposed. The latter configuration allows the bottom surface to be electrically coupled to an interconnect substrate when third die 140' has one or more electrical terminals on its bottom surface, and/or thermally coupled to an interconnect substrate for dissipation of heat, or to enable another set of elements 110'-150' to be stacked below with a minimum spacing distance. Body 160' is also preferably disposed so as to leave the bottom surfaces of conductive bodies 130''' exposed. Body 160' may comprise an epoxy (such as an epoxy molding compound), a silicone, and/or a polyimide (i.e., it may comprise one or more of these materials). Body 160' may also comprise an underfill material that is disposed around the sides of semiconductor die 140', and which may be sucked in to cover the die's top surface by capillary action.

Figure 6:
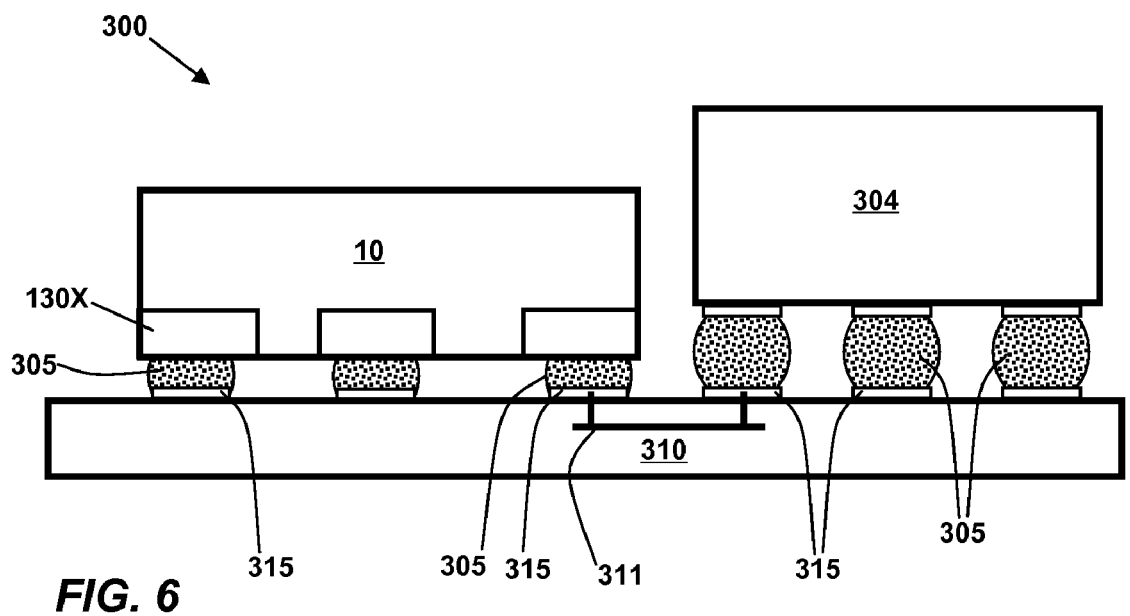
FIG. 6 shows a side view of an exemplary system according to the present invention.

FIG. 6 is a side view of an exemplary system 300 that comprises an interconnect board 310 having a plurality of electrical interconnect pads 315, package 10 disposed on the top surface interconnect board 310, where package 10 may comprise an instance of package 100, package 200, or package 250, or combinations thereof. The conductive bodies 130X of package 10 are electrically coupled to respective pads 315 by corresponding bodies 305 of electrically conductive adhesive, which may comprise a solder, an electrically conductive polymer, etc. System 300 also comprises an electrical package 304 that is also electrically coupled to respective pads 315 by adhesive bodies 305. Package 304 may comprise a passive electronic component, or may comprise a package having the same construction as package 10, or a different construction, and may be electrically coupled to package 10 by one or more electrical traces 311 disposed in or on interconnect substrate 310.

Figure 7:
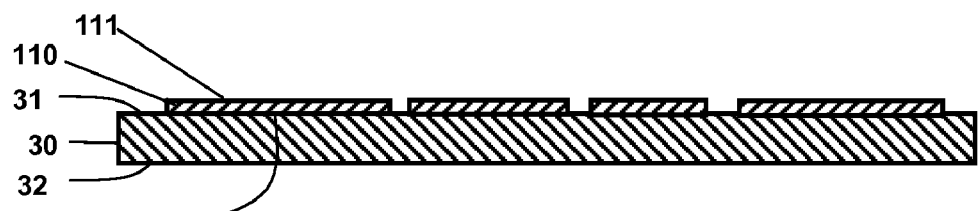
FIGS. 7-15 show views of package assemblies during various stages of fabrication according to exemplary embodiments of the present invention.

FIGS. 7-15 illustrate exemplary methods of making packages 100 and 200. Referring to FIG. 7, the exemplary method comprises forming patterned conductive layer 110 over a metallic substrate 30, with the patterned conductive layer 110 having first surface 111, second surface 112, thickness T1 between its surfaces, and a plurality of traces, as described above. Metallic substrate 30 will be subsequently processed to provide conductive bodies 130. Metallic substrate 30 has a first surface 31 disposed on (e.g., in contact with) second surface 112 of conductive layer 110, a second surface 32, and a second thickness T2 between its surfaces, with T1 being less than T2. Exemplary values and ranges for T1 and T2 were provided above. For high-volume manufacturing, metallic substrate 30 may be provided by a long strip of metal that provides enough material for several hundred instances of package 100. Alignment holes are preferably preformed along each of the long edges of the strip, similar to those provided on a reel of leadframes, to allow the strip to be conveyed through automated high-speed processing equipment. Conductive layer 110 may be formed by depositing and/or plating metal onto metallic substrate, and thereafter pattern etching the layer. In this case, layer 110 and metallic substrate 30 preferably comprise different metals, and the etchant may comprise a selective etchant that etches conductive layer 110 at a faster rate than metallic substrate 30. Conductive layer 110 may comprise gold (Au), nickel (Ni), silver (Ag), another conventional plating metal, or any combination of sub-layers. Metallic substrate 30 may comprise copper. Prior to etching, a patterned mask layer may be formed on the surface of the metal for layer 110, such as by screen printing, ink stamping, or by applying a photoresist film or disposing a photoresist layer, pattern exposing the photoresist by actinic radiation, and developing the photoresist. Screen printing and ink stamping are suitably fast for high-volume manufacturing, but have relatively low feature resolution, and are best used for semiconductor die that have large area terminal pads. Photoresist processing is more complex, but provides higher feature resolution, and can be used for semiconductor die that have small area terminals. After plating, the mask layer may be removed by a suitable solvent.

Conductive layer 110 may also be formed by a selective plating process. In such a process, layer 110 is plated onto metallic substrate 30 with a patterned mask layer previously disposed on metallic substrate 30. The mask layer may be formed by any of the above described processes. Metal for layer 110 is only plated on the portions of surface 31 that are exposed by the patterned mask layer. Conventional electrolytic plating and/or electroless plating may be used. After plating, the patterned mask layer may be removed by a suitable solvent. Conductive layer 110 may also be formed by a metal lift-off process. In such a process, layer 110 is deposited onto metallic substrate 30 with a thick patterned mask layer previously disposed on metallic substrate 30. The patterned mask layer may be formed by any of the above described processes. Metal for layer 110 is formed on both the mask layer and the exposed portions of substrate 30. The mask layer is thereafter removed by a suitable solvent, taking with it the metal that was formed on the mask layer. The thickness of the mask layer is chosen to prevent the metal from completely covering the sidewalls of the mask layer, thereby allowing the solvent to contact the pattern edges of the mask layer. In all of the above processes, conductive layer 110 may comprise a single layer of metal, or two or more sub-layers of different metals.

Figure 8:
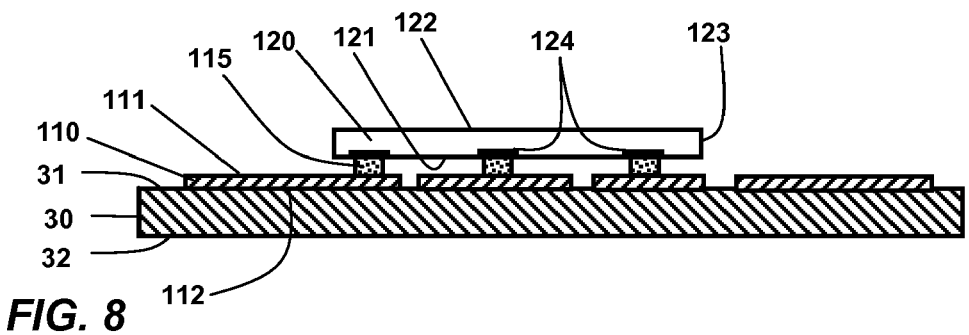

Referring to FIG. 8, the exemplary method further comprises assembling semiconductor die 120 and the first surface 111 of patterned conductive layer 110 together such that conductive regions 124 on the die's surface are electrically coupled to a plurality of the traces of the patterned conductive layer. In preferred implementations, this comprises flip-chip bonding semiconductor die 120 onto first surface 111. Solder ball bumping may be used. In an exemplary process, solder balls are disposed or pre-disposed on conductive regions 124 of semiconductor die 120, a patterned solder mask is optionally screen printed onto layer 110, solder paste is disposed on the locations of layer 110 that are to make contact with the solder bumps, the die is flipped into confronting position with layer 110, and heat is applied to reflow at least the solder paste. As another approach, stud bumping gold or copper studs with thermo-sonic bonding may be used. In an exemplary process, gold or copper studs are disposed or pre-disposed on conductive regions 124 of semiconductor die 120, the die is flipped into confronting position with layer 110, and the thermo-sonic bonding is applied to the die. Prior to the thermo-sonic bonding, solder paste or an anisotropic conductive film (ACF) may be disposed on the locations of layer 110 that make contact with the studs.

Figure 9:
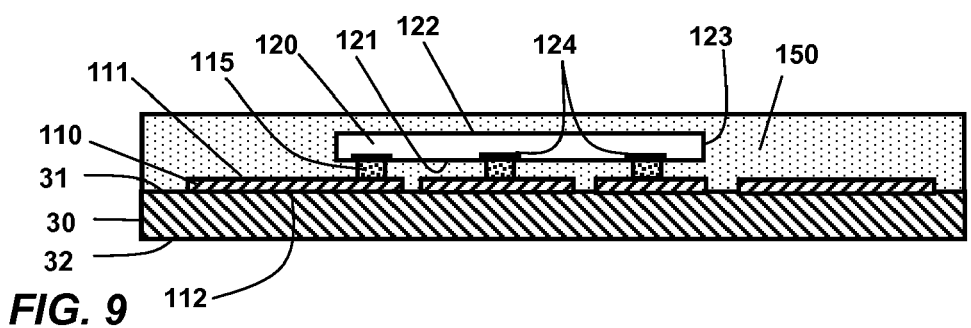

Referring to FIG. 9, the exemplary method further comprises disposing a body 150 of an electrically insulating material over semiconductor die 120 and a portion of first surface 111 of patterned conductive layer 110. Body 150 is preferably disposed in a liquid state, and thereafter solidified, such as by application of a thermal treatment (such as heating before or after deposition), ultra-violet light treatment, and/or a chemical treatment (e.g., chemical reaction). Body 150 may comprise an epoxy (such as an epoxy molding compound), a silicone, and/or a polyimide (i.e., it may comprise one or more of these materials). Body 150 may be disposed by any conventional molding process, screen printing process, etc. To enable another package to be stacked above package 100, body 150 may be molded so as to not cover the top portions of layer 100 and substrate 30 where conductive bodies 130 will be located.

Figure 10:
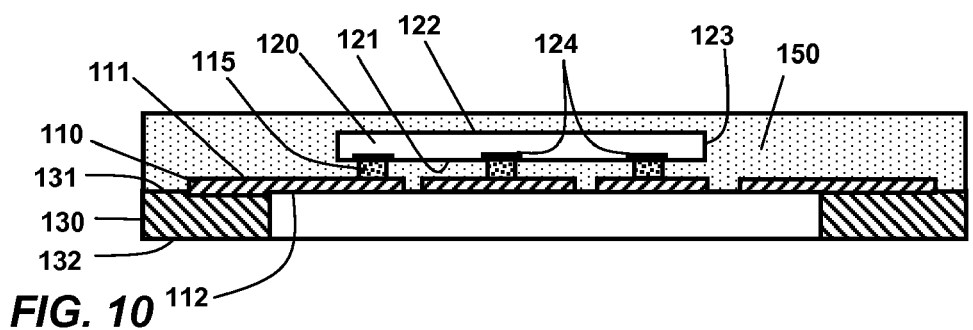

Referring to FIG. 10, the exemplary method further comprises pattern etching metallic substrate 30 at its second surface 32 to define conductive regions 130 and exposing a portion of the second surface 112 of the patterned conductive layer 110. Each conductive region 130 has a first surface 131 at first surface 31 of metallic substrate 30, and a second surface 132 at second surface 32 of metallic substrate 30. The pattern etching may comprise disposing a patterned etching mask on second surface 32, and exposing second surface 32 to an etchant. In preferred implementations, patterned conductive layer 110 comprises a metal that is different from that in metallic substrate 30, and the etchant comprises a selective etchant that etches substrate 30 at a higher rate than patterned conductive layer 110. The mask layer may be formed on second surface 32 by any conventional process, such as by screen printing, ink stamping, applying a photoresist film, or coating a layer of photoresist.

At this point, the exemplary method can provide a completed package for one or more semiconductor die disposed on first surface 111 of patterned conductive layer 110. If a carrier strip was used to manufacture package 100 and other packages, package 100 may be separated from the carrier strip using conventional dicing and cutting tools.

Figure 11:
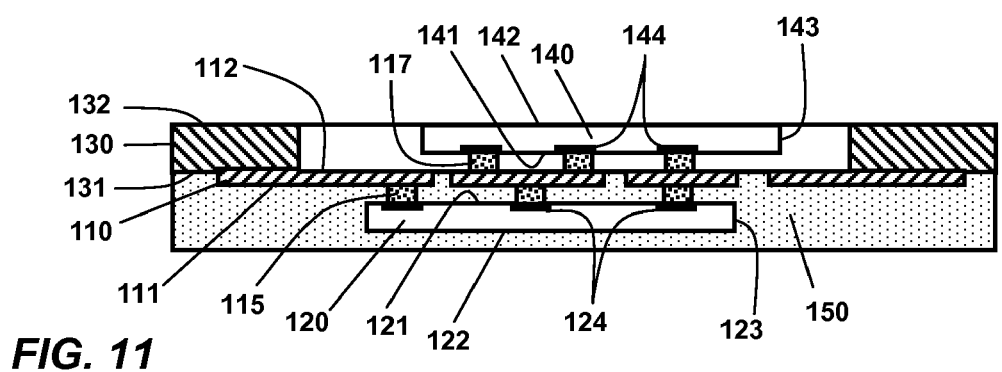

The exemplary method may comprise additional actions to provide one or more additional semiconductor dice in the package. Referring to FIG. 11, the exemplary method may further comprise assembling second semiconductor die 140 and the second surface 112 of patterned conductive layer 110 together such that conductive regions 144 on the die's surface are electrically coupled to a plurality of the traces of the patterned conductive layer. In preferred implementations, this comprises flip-chip bonding semiconductor die 140 onto second surface 112. Solder ball bumping may be used. In an exemplary process, solder balls are disposed or pre-disposed on conductive regions 144 of semiconductor die 140, solder paste is disposed on the locations of layer 110 that are to make contact with the solder bumps, the die is flipped into confronting position with layer 110, and heat is applied to reflow at least the solder paste. As another approach, stud bumping gold or copper studs with thermo-sonic bonding may be used. In an exemplary process, gold or copper studs are disposed or pre-disposed on conductive regions 144 of second semiconductor die 140, the die is flipped into confronting position with layer 110, and the thermo-sonic bonding is applied to the die. Prior to the thermo-sonic bonding, solder paste or an anisotropic film (ACF) may be disposed on the locations of layer 110 that make contact with the studs.

Figure 12:
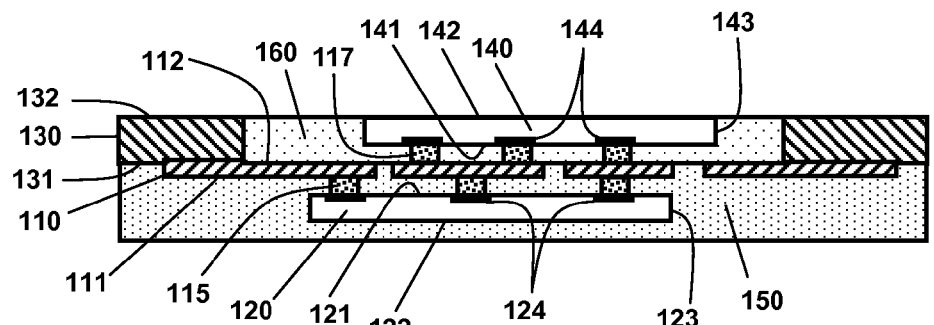

At this point, the exemplary method can provide a completed package for semiconductor dice disposed on first surface 111 and second surface 112 of patterned conductive layer 110. If a carrier strip was used to manufacture package 100 and other packages, package 100 may be separated from the carrier strip using conventional dicing and cutting tools. As an optional step, a body 160 of an electrically insulating material may be disposed along the edges of second semiconductor die 140 and on a portion of second surface 112 of patterned conductive layer 110, as shown in FIG. 12. Body 160 is preferably disposed in a liquid state, and thereafter solidified, such as by application of a thermal treatment (such as heating before or after deposition), ultra-violet light treatment, and/or a chemical treatment (e.g., chemical reaction). Body 160 may comprise an epoxy (such as an epoxy molding compound), a silicone, and/or a polyimide (i.e., it may comprise one or more of these materials). Body 160 may be disposed by any conventional molding process, screen printing process, etc. Body 160 may also comprise a conventional underfill material disposed along one or more sides of die 140 using conventional underfill dispensing equipment.

Figure 13:
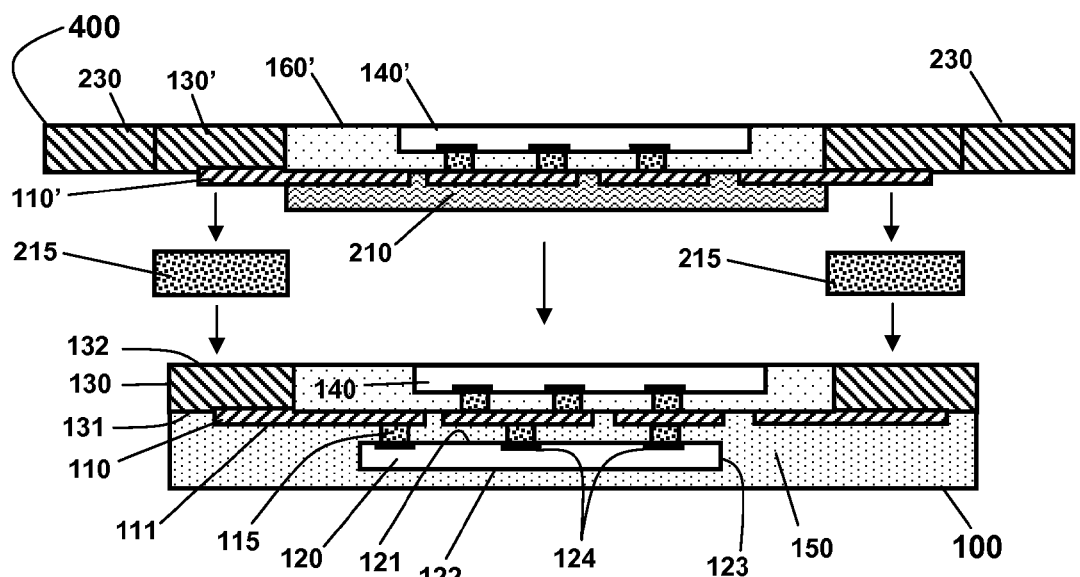
Figure 14:
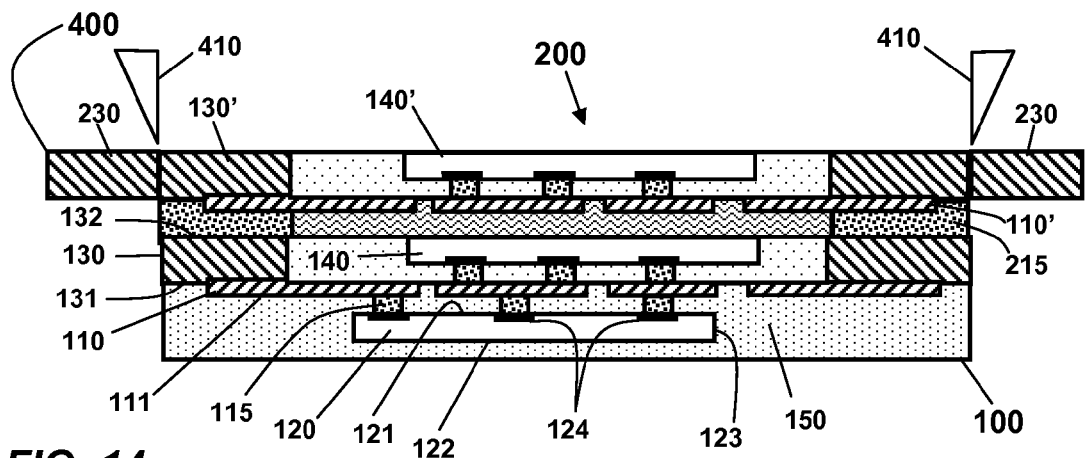

The exemplary method may be extended to manufacture package 200. The extended method may further comprise manufacturing a sub-assembly 400 of second patterned conductive layer 110', conductive regions 130', semiconductor die 140', body 160' of insulating material, and electrically insulating layer 210, and thereafter assembling the sub-assembly with package 100 with adhesive conductive bodies 215, as shown in FIG. 13. Sub-assembly 400 may be constructed with a retaining ring 230 formed around conductive bodies 130' to keep the bodies 130' in place during the manufacturing of sub-assembly 400. Sub-assembly 400 may be manufactured with the previously described actions for assembling elements 110, 130, 140, and 160, with electrically insulating layer 210 added thereafter by screen printing, film application, or other deposition processes. The result of assembling sub-assembly 400 with package 100 is shown in FIG. 14. At this point, retaining ring 230 may be removed by dicing, cutting, or other separation processes, as illustrated by blades 410 in FIG. 14, resulting in package 200.

Figure 15:
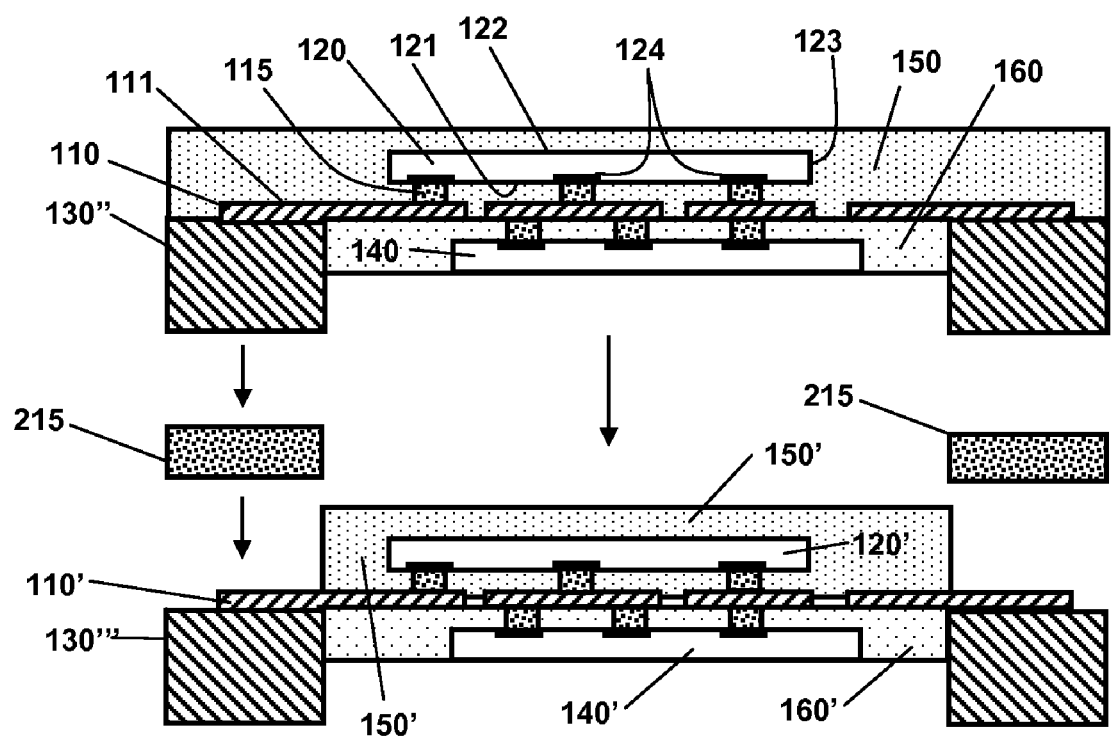

The exemplary method may also be extended to manufacture package 250. In this extended method, two or more packages 100 are manufactured with conductive bodies 130 replaced by conductive bodies 130" and 130'", and with electrically insulating body 150' replacing at least one of the electrically insulating bodies 150. The two packages are assembled together with adhesive conductive bodies 215, as shown in FIG. 15. Three or more packages may be similarly assembled together.

It should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

The semiconductor die packages described above can be used in electrical assemblies including circuit boards with the packages mounted thereon. They may also be used in systems such as phones, computers, etc. It may be appreciated that more than additional semiconductor dice may be assembled with each package to provide greater functionality and circuit density.

Some of the examples described above are directed to "leadless"-type packages such as MLP-type packages (molded leadless packages) where the terminal ends of the leads do not extend past the lateral edges of the molding material. Embodiments of the invention may also include leaded packages where the leads extend past the lateral surfaces of the molding material.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
   a patterned metal conductive layer having a first planar surface, a second planar surface parallel to the first planar surface, a first thickness between its first and second surfaces, and at least one conductive trace, the at least one conductive trace having a first surface at the first surface of the patterned conductive layer, a second surface at the second surface of the patterned conductive layer, and a patterned shape at the first surface of the patterned conductive layer and that extends through the first thickness of the patterned conductive layer to the second surface of the patterned conductive layer;
   a semiconductor die disposed over the first surface of the patterned conductive layer and electrically coupled thereto;
   a plurality of conductive bodies disposed at the second surface of the patterned conductive layer and electrically coupled thereto, each conductive body having a thickness that is greater than the first thickness; and
   a body of electrically insulating material disposed on the semiconductor die and a portion of the first surface of the patterned conductive layer, and
   wherein the patterned shape of the at least one conductive trace has a first portion disposed under the semiconductor die and electrically coupled to a conductive region of the semiconductor die by a conductive solder ball or conductive stud bump, wherein solder ball or conductive stud bump directly contacts both the first portion of the patterned shape and said conductive region of the semiconductor die, wherein the patterned shape further has a second portion over at least one of the conductive bodies and metallurgically bonded thereto for an electrical connection thereto, and wherein the second portion of the patterned shape is disposed away from the semiconductor die such that the second portion is not under the semiconductor die.

2. A semiconductor die package according to claim 1, wherein the patterned conductive layer is metallurgically bonded to the plurality of conducive bodies.

3. A semiconductor die package according to claim 1, wherein the plurality of conductive bodies comprise a metal different from that of the patterned conductive layer.

4. A semiconductor die package according to claim 1, wherein the first thickness is in a range from 2 microns to 20 microns, and where the thicknesses of the conductive bodies are in a range from 50 microns to 500 microns.

5. A semiconductor die package according to claim 1, wherein the body of electrically insulating material comprises one or more of the following: an epoxy, a silicone, a polyimide.

6. A semiconductor die package according to claim 1, wherein the first semiconductor die comprises a plurality of conductive regions coupled to corresponding portions of the patterned conductive layer by electrically conductive adhesive members.

7. A semiconductor die package according to claim 1, further comprising:
   a second semiconductor die disposed over the second surface of the patterned conductive layer and electrically coupled thereto.

8. A semiconductor die package according to claim 7, further comprising a second body of electrically insulating material disposed on at least a portion of the second surface of the patterned conductive layer and adjacent to at least one side of the second semiconductor die.

9. A semiconductor die package according to claim 8, wherein the second body of electrically insulating material comprises one or more of the following: an epoxy, a silicone, a polyimide.

10. A semiconductor die package according to claim 8, wherein the second body of electrically insulating material comprises an underfill material disposed adjacent to at least one side of the second semiconductor die.

11. A semiconductor die package according to claim 7, wherein the second semiconductor die comprises a plurality of conductive regions coupled to corresponding portions of the patterned conductive layer by electrically conductive adhesive members.

12. A semiconductor die package according to claim 7, wherein the first semiconductor die has at least one conductive region electrically coupled to a first trace of the patterned conductive layer, and wherein the second semiconductor die has at least one conductive region electrically coupled to the first trace of the patterned conductive layer.

13. A semiconductor die package according to claim 1, further comprising a second patterned conductive layer having a first surface facing the plurality of conductive bodies, a second surface opposite to its first surface, and a thickness between its first and second surfaces;
   a second semiconductor die disposed over a surface of the second patterned conductive layer and electrically coupled thereto; and
   a plurality of second conductive bodies disposed at the second surface of the second patterned conductive layer and electrically coupled thereto, each conductive body having a thickness that is greater than the thickness of the second patterned conductive layer.

14. A system comprising an interconnect substrate and the semiconductor die package of claim 1 attached to the interconnect substrate.

15. A method of fabricating a semiconductor die package, comprising:
   forming a patterned metal conductive layer over a metallic substrate, the patterned conductive layer having a first planar surface, a second planar surface parallel to the first planar surface, a first thickness between its first and second surfaces, and a plurality of traces, the metallic substrate having a first surface disposed on the second surface of the conductive layer, a second surface, and a second thickness between its first and second surfaces, the first thickness being less than the second thickness, at least one conductive trace having a first surface at the first surface of the patterned conductive layer, a second surface at the second surface of the patterned conductive layer, and a patterned shape at the first surface of the patterned conductive layer and that extends through the first thickness of the patterned conductive layer to the second surface of the patterned conductive layer;
   assembling a semiconductor die and the first surface of the patterned conductive layer together such that a plurality of conductive regions on a surface of the semiconductor die are electrically coupled to a plurality of the traces of the patterned conductive layer;
   disposing a body of an electrically insulating material over the semiconductor die and a portion of the first surface of the patterned conductive layer; and
   pattern etching the metallic substrate at its second surface to define a plurality of conductive regions disposed at the second surface of the patterned conductive layer and exposing a portion of the second surface of the patterned conductive layer, each conductive body being electrically coupled to the patterned conductive layer and having a thickness that is greater than the first thickness, and wherein the patterned shape of the at least one conductive trace has a first portion disposed under the semiconductor die and electrically coupled to a conductive region of the semiconductor die by a conductive solder ball or conductive stud bump, wherein solder ball or conductive stud bump directly contacts both the first portion of the patterned shape and said conductive region of the semiconductor die, wherein the patterned shape further has a second portion over at least one of the conductive bodies and metallurgically bonded thereto for an electrical connection thereto, and wherein the second portion of the patterned shape is disposed away from the semiconductor die such that the second portion is not under the semiconductor die.

16. The method claim 15 further comprising assembling a second semiconductor die and the exposed second surface of the patterned conductive layer together such that a plurality of conductive regions on a surface of the second semiconductor die are electrically coupled to a plurality of the traces of the patterned conductive layer.

17. The method of claim 16 further comprising disposing another body of an electrically insulating material along one or more edges of the second semiconductor die and on a portion of the second surface of the patterned conductive layer.

18. The method claim 15 wherein forming the patterned conductive layer comprises forming a conductive layer on the first surface of the metallic substrate and pattern etching the formed conductive layer.

19. The method claim 15 wherein forming the patterned conductive layer comprises forming a patterned mask layer on the first surface of the metallic substrate, and plating metal onto the portions of first surface of the metallic substrate that are exposed by the patterned mask layer.

20. The method of claim 15 wherein assembling the semiconductor die and the first surface of the patterned conductive layer comprises flip-chip bonding the semiconductor die onto the first surface of the patterned conductive layer.

21. A semiconductor die package according to claim 7, wherein the at least one conductive trace further has a third portion at its second surface that is disposed over the second semiconductor die and electrically coupled to a conductive region of the second semiconductor die.

22. A semiconductor die package according to claim 13, wherein portions of the first surface of the second patterned conductive layer are attached to the plurality of conductive bodies by a plurality of conductive adhesive members, and wherein the second semiconductor die is disposed over the first surface of the second patterned conductive layer and electrically coupled thereto.

23. A semiconductor die package according to claim 1, further comprising:
   a second semiconductor die disposed over the second surface of the patterned conductive layer, the second semiconductor die having a plurality of conductive regions facing the patterned conductive layer; and
   a body of electrically conductive solder that is directly attached to a third portion of the patterned shape of the at least one conductive trace and directly attached to a conductive region of the second semiconductor die.

24. A semiconductor die package according to claim 1, further comprising:
   a second semiconductor die disposed over the second surface of the patterned conductive layer, the second semiconductor die having a plurality of conductive regions facing the patterned conductive layer; and
   an electrically conductive stud bump that is directly attached to a third portion of the patterned shape of the at least one conductive trace and directly attached to a conductive region of the second semiconductor die.

* * * * *